United States Patent [19]
Lin et al.

[11] Patent Number: 5,264,397
[45] Date of Patent: Nov. 23, 1993

[54] METHOD FOR ACTIVATING ZINC IN SEMICONDUCTOR DEVICES

[75] Inventors: Shwu L. Lin, North Brunswick; John D. Kulick, Pittstown; Randall B. Wilson, Maplewood, all of N.J.

[73] Assignee: The Whitaker Corporation, Wilmington, Del.

[21] Appl. No.: 656,908

[22] Filed: Feb. 15, 1991

[51] Int. Cl.$^5$ .................... H01L 21/20; H01L 21/324
[52] U.S. Cl. .................................. 437/247; 437/126; 437/130; 437/119; 437/129
[58] Field of Search ............... 437/126, 130, 129, 133, 437/119, 134, 155, 247

[56] References Cited

U.S. PATENT DOCUMENTS

| | | | |
|---|---|---|---|
| 3,773,571 | 11/1973 | Rupprecht et al. | 437/133 |
| 3,899,371 | 8/1975 | Ladany et al. | 437/133 |
| 3,909,319 | 9/1975 | Fujiwara et al. | 437/155 |
| 3,975,555 | 8/1976 | Ladany et al. | 437/134 |
| 3,996,891 | 12/1976 | Isawa et al. | 437/119 |
| 4,479,222 | 10/1984 | Hawrylo | 437/129 |

FOREIGN PATENT DOCUMENTS 0242084 10/1987 European Pat. Off. .

OTHER PUBLICATIONS

Wolf et al. in "Silicon Processing for the VLSI Era" p. 58 (1986).
VLSI Fabrication Principles by Ghandhi, John Wiley 1983.
Cole, et al. "Effect of Cooling Ambient on Electrical Activation of Dopants in Movpe of Inp", Elec. Letters, Jul. 21, 1988, vol. 24, No. 15, pp. 929-931.
Antell et al. "Passivation of zinc acceptors in InPhy Atomic Hydrogen Coming from Arsine During Metal-organic Epitoxy," Appl. Phys. Lett 53(9)29, Aug. 1988, pp. 758-760.
Van Gurp et al., 65 J. Appl. Phys. 553, (1989), 64 J. Appl. Phys. 3468 (1988) and 61 J. App. Phys. 1846 (1987).
Dlubek et al., "Vacancy-Zn Complexes Studied by Positions" App. Phys. Letter 46 (12), Jun. 15, 1985; pp. 1136-1138.
Friedler et al., J. Crystal Growth vol. 74, p. 27 (1986).
Henry et al., QE-19 IEEE J. Quant Elec. 905 (1983).
Heinen et al., Siemens Forsch and Entwich, 209 (1982).
Grothe et al., ED-28, IEEE Trans. Elec. Dev. 371 (1981).

*Primary Examiner*—Olik Chaudhuri
*Assistant Examiner*—Ramamohan Rao Paladugu
*Attorney, Agent, or Firm*—Gerald K. Kita; Driscoll A. Nina, Jr.

[57] ABSTRACT

A method for activating the zinc dopant in an active layer of a Group III/Group V semiconductor device comprises forming a layer of zinc doped Group III/-Group IV material, and thereafter annealing the layer at a predetermined temperature and for a predetermined time sufficient to convert inactive zinc in the layer to acceptor zinc. In a preferred embodiment of the invention, a method for activating zinc dopant in the active layer of an InP-InGaAsP double heterostructure comprises annealing the active layer at a temperature of about 625° C. for at least about 190 seconds which converts inactive zinc to acceptor zinc without substantially decreasing the total zinc in the active layer. In another preferred embodiment, a method for increasing the power output of InP-InGaAsP optoelectronic semiconductor device, such as a laser or an LED having a zinc doped active layer, comprises annealing the active layer of the semiconductor device at a temperature of about 625° C. for at least about 190 seconds.

24 Claims, 4 Drawing Sheets

2

METHOD FOR ACTIVATING ZINC IN SEMICONDUCTOR DEVICES

FIELD OF THE INVENTION

The present invention relates to a method for activating zinc-dopant in an active layer of a Group III/Group V semiconductor device. More particularly, the present invention relates to a method for increasing the net acceptor concentration in a zinc-doped active layer of an InP-InGaAsP double heterostructure device.

BACKGROUND OF THE INVENTION

A variety of different methods are known for fabricating Group III/Group V semiconductor devices. For example, it is well known in the art to fabricate doped single crystal epitaxial layers in the InGaAsP materials system on an InP substrate using conventional growth techniques such as Liquid Phase Epitaxy (LPE), Molecular Beam Epitaxy (MBE), Metal-Organic Chemical Vapor Deposition (MOCVD), and Metal-Organic Vapor Phase Epitaxy (MOVPE).

It is well known in the art to fashion such Group III/Group V layers into an assortment of optoelectronic semiconductor devices, such as semiconductor lasers and LEDs. Generally, these optoelectronic devices are double heterostructures having an active layer sandwiched between a buffer layer and a cladding layer. Frequently, these optoelectronic devices also include a cap layer on top of the cladding layer so that an ohmic contact with a subsequently deposited metal contact layer is formed.

Despite zinc's wide use as a p-type dopant in InP-InGaAsP semiconductor devices, such as in the active layers of InP-InGaAsP double heterostructures, the exact mechanism of the incorporation of zinc into the InGaAsP crystal lattice so that it acts as an acceptor is not well understood.

As used herein a material in the InGaAsP materials system refers to a semiconductor alloy having a composition $In_xGa_{1-x}As_yP_{1-y}$, within the range $0 \leq x \leq 1$, $0 \leq y \leq 1$.

A number of researchers have recently considered how zinc may be incorporated as an acceptor in the InGaAsP materials system. For example, the acceptor concentration (i.e. the electrical doping level) of an MOVPE grown p-type InGaAsP capping layer cooled from typical MOVPE growth temperatures is strongly dependent on the gaseous cooling ambient. This is the result of electrical deactivation rather than loss of dopant. Specifically, when the cooling ambient is $PH_3$ or $AsH_3$, atomic hydrogen is bound in the crystal lattice and serves to deactivate the Zn (see e.g.; S. Cole et al "Effect of Cooling Ambient on Electrical Activation of Dopants in MOVPE of InP" Electronics Letters, Jul. 21, 1988, Vol 24, No. 15, pp. 929-931; and G. R. Antell et al "Passivation of Zinc Acceptors in InP by Atomic Hydrogen Coming from Arsine During Metalorganic Vapor Phase Epitaxy," Appl Phys Lett 53(9) Aug. 29, 1988 pp. 758-760). In particular, it has been observed that the acceptor concentration of a sample cooled in $AsH_3$ can be restored by heat treating in $PH_3$ or $H_2$ for a short period of time (see European Patent application 0 242 084).

In a recent series of papers, Van Gurp et al have shown that closed ampoule Zn diffusion in an InP surface layer results in a net acceptor concentration that is much smaller than the Zn concentration. In particular, Van Gurp et al have shown that a relatively large fraction of the total zinc atoms diffused into the InP are not incorporated into the crystal lattice but instead are located in interstitial sites. The interstitial zinc atoms act as a donor species rather than as an acceptor species and offset the acceptor properties of the substitutional zinc atoms. This results in a net acceptor concentration that is much smaller than the total zinc concentration. Van Gurp et al have also shown that when a zinc diffused surface layer is subsequently annealed at a temperature in the range of 475°-500° C., the interstitial zinc can redistribute, giving rise to a substantial increase in the net acceptor concentration. Van Gurp et al explain their results as occurring because zinc is incorporated as both substitutional acceptors and interstitial donors in the InP surface layer; however, when the InP surface layer is annealed, only the interstitial zinc is driven out via the surface owing to its large diffusion coefficient. Thus, the ratio of substitutional zinc to interstitial zinc increases giving rise to an apparent increase in the net acceptor concentration. (See, Van Gurp et al, 65 J. Appl. Phys. 553 (1989), 64 J. Appl. Phys. 3468 (1988), and 61 J. Appl. Phys. 1846 (1987)).

G. Dlubek et al (see "Vacancy—Zn Complexes Studied by Positrons" Appl. Phys. Lett 46(12) Jun. 15, 1985; pp 1136-1138) also discuss the formation of Zn complexes's in Zn doped InP bulk crystals and the disassociation of such complexes and out diffusion of Zn from the surface via the evaporation of interstitial zinc at temperatures above 400° C.

In short, the above described prior art indicates that the mechanism by which zinc is incorporated into the lattice of an InP/InGaAsP material and activated to act as acceptor is not well understood.

In particular, the prior art provides no generally applicable technique for controlling the activation of zinc as an acceptor in the active layer of a Group III/-Group IV semiconductor device. The technique for activating zinc described in the above mentioned European Patent Application relates only to the situation where a MOVPE grown layer is initially cooled in an atmosphere containing $AsH_3$ so that hydrogen is incorporated in the crystal lattice to passivate zinc and wherein the layer is reheated in an atmosphere of $PH_3$ or $H_2$ to reactivate the zinc.

This technique has a number of shortcomings. Firstly, it can only be used to activate zinc in a MOVPE grown layer initially cooled in an $AsH_3$ ambient. In addition, it has not been shown to be applicable to the active layer of a device but only to an upper cladding layer and a cap layer in a double heterostructure. Thirdly, the technique is not applicable for activating zinc in LPE grown layer such as the active layer of an LPE grown double heterostructure.

The Van Gurp et al and Dlubek et al references only describe the out diffusion of interstitial zinc from the surface of an InP material to increase the net zinc acceptor concentration. The technique of Van Gurp and Dlubek therefore also has a number of shortcomings. In particular, it has not been shown in the above-mentioned references that the technique can activate zinc as an acceptor in the active layer of a device. The technique is especially not applicable for activating zinc in the active layer of a double heterostructure device wherein the active layer is not a surface layer but is sandwiched between a cladding layer and a buffer layer. The technique of Van Gurp and Dlubek is especially not applicable to activating zinc in the active layer of an LPE grown double heterostructure device.

In addition, none of the prior art in zinc activation techniques disclose how to control the activation of zinc as an acceptor in an active layer to improve the power output of an LED or laser such as a double heterostructure LED or laser.

Accordingly, it is an object of the present invention to provide a method for activating zinc impurities in the active layer of a Group III/Group V semiconductor device.

It is a further object of the invention to provide a method for activating zinc impurities in the active layer of a double heterostructure device such as an InP/InGaAsP double heterostructure LED or laser.

It is a further object of the invention to provide a method for activating zinc as an acceptor in an LPE grown Group III/Group V layer such as a layer formed in the InGaAsP materials system.

It is a further object of the invention to provide a method for activating zinc as an acceptor in the active layer of a light emitting semiconductor device such as an InP/InGaAsP double heterostructure LED or laser to improve the power output characteristics.

SUMMARY OF INVENTION

The present invention is a method for activating zinc dopant in the active layer of a Group III/Group V semiconductor device. The method comprises forming the active layer by a conventional growth technique such as LPE and thereafter annealing the active layer at a predetermined temperature for a predetermined time sufficient to convert inactive zinc dopant to acceptor zinc.

In a preferred embodiment of the invention, a method is provided for activating zinc dopant in the active layer of an LPE grown Inp/InGaAsP double heterostructure by annealing the active layers at a temperature of about 625° C. for at least about 190 seconds to convert inactive zinc to acceptor zinc without substantially decreasing the total zinc in the active layer. The annealing of the active layer of the double heterostructure may take place before or after the cladding and cap layers are grown or during the growth of the cladding and cap layers.

As is shown below, the inventive annealing technique can be utilized to substantially increase the power output of a laser or LED.

DETAILED DESCRIPTION OF THE INVENTION

The invention is directed to a method for controlling the net acceptor concentration, and for activating the zinc dopant, by annealing the active layer of a Group III/Group V semiconductor device. The annealing is carried out by subjecting a zinc-doped active layer to a predetermined annealing temperature for a predetermined period of time. As used herein, the term "annealing" refers to maintaining a semiconductor layer or device at a specified temperature for a specified period of time so that a state of thermal equilibrium is reached.

When liquid phase epitaxy is used, the annealing of the active layer may be carried out during the growth phase of subsequent layers grown on the wafer. For example, in the case of a double heterostructure, the annealing of the active layer may be accomplished during the growth of cladding or cap layers at elevated temperatures after the active layer has already been formed. Alternatively, the active layer may be annealed during a separate heating step carried out before the cladding and cap layers are grown or after all the epitaxial layers have been grown on the substrate. For example, in the supercooling growth mode, the layer thickness is determined by the growth time and the degree of supersaturation of the melt. Therefore, the melt composition for the cladding and cap layers can be adjusted according to the predetermined annealing time such that the degree of supersaturation will satisfy the layer thickness requirement.

The inventive annealing method will now be described by reference to a specific example wherein an InP-InGaAsP double heterostructure with a zinc-doped active layer is formed by liquid phase epitaxy (LPE).

Figure 1:
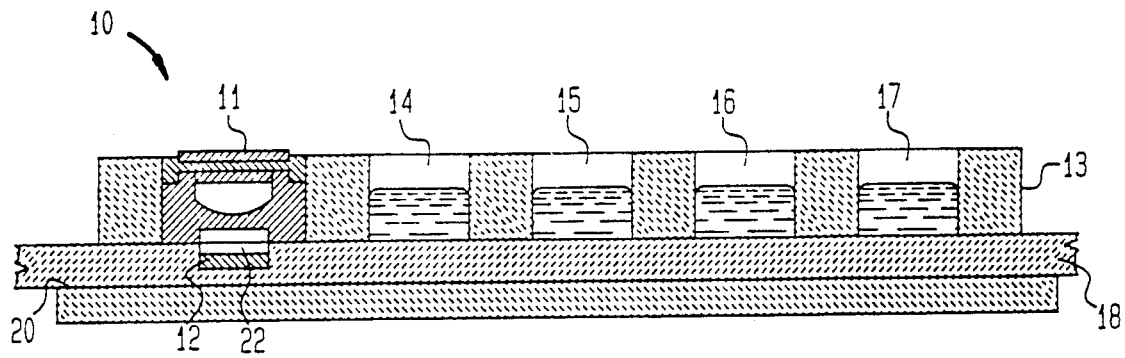
FIG. 1 is a schematic drawing of an apparatus suitable for fabricating a Group III/Group V semiconductor device by liquid phase epitaxy.

Referring to FIG. 1, a typical apparatus 10 for carrying out the LPE growth is schematically illustrated. The LPE apparatus 10 comprises a refractory furnace boat 13 made of an inert material such as graphite. The boat 13 is provided with a number of wells or bins, shown here as wells 14, 15, 16 and 17, although more wells may be provided. The boat 13 is also equipped with a movable slide 18 which is also suitably made from a refractory material such as graphite. The slide 18 is disposed in a recess 20 near the bottom of the boat 13, so that the upper surface of slide 18 is coplanar with the plane of the bottom of each of the wells or bins 14, 15, 16 and 17. A slot 22 is provided in the upper surface of slide 18, near one end of the slide. The slot 22 is large enough to accommodate a wafer such as an InP wafer 12. The depth of the slot 22 is typically about 100 microns more than the thickness of the substrate. The apparatus 10 also comprises a Sn:InP protection chamber 11. The protection chamber 11 is conventional and is used to protect wafer 12 from thermal decomposition prior to initiating growth. The protection chamber 11 may also be used for carrying out post-growth annealing when such a step is used for activating the zinc dopant. To use the apparatus 10 to grow a double heterostructure, a sulfur doped InP substrate is positioned in the slot 22 so that the substrate surface on which the InP-InGaAsP layers are to be grown, in this case the (100) plane, is uppermost.

Each of the wells is loaded with a solid charge of the semiconductor materials to be deposited on the substrate 12, e.g., InP, GaAs or InAs with suitable doping material. The boat is then heated to a temperature well above the melting point of the different charges, for example, to a temperature of about 650° C. While the boat is being heated, the substrate 12 is kept in the protection chamber to prevent decomposition of the InP substrate 12 as shown in FIG. 1. When all of the charges in the different wells have melted, the furnace is allowed to cool slowly until the desired temperature at which each layer will be grown is reached.

The InP substrate 12 is moved from well to well as the desired growth temperature for each layer is reached so that four layers of different composition are successively grown on the wafer 12.

Figure 2:
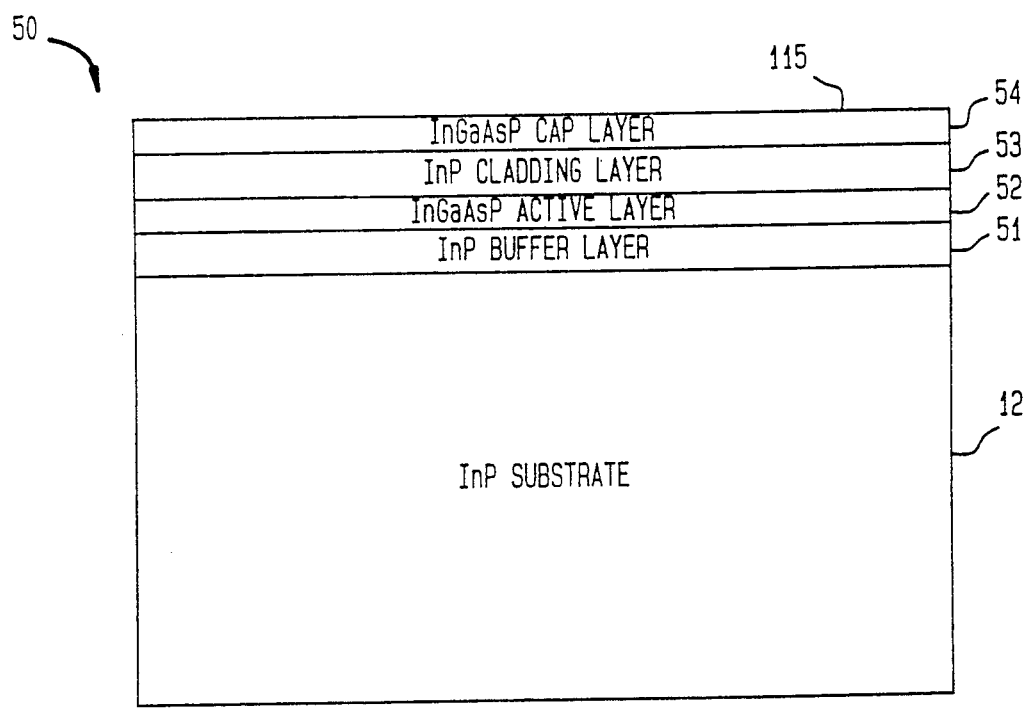
FIG. 2 shows a double heterostructure formed on a Group III/Group V wafer using the apparatus of FIG. 1.

Illustratively, the four layers are in sequence a buffer layer, active layer, cladding layer and cap layer of a double heterostructure. A double heterostructure 50 which may be grown on the wafer 12 is shown in FIG. 2. The double heterostructure of FIG. 2 comprises the following layers grown on InP substrate 12:

1) buffer layer 51 of n-InP (Sn-doped, $1-4 \times 10^{18}$ cm$^{-3}$, 2-5 μm thick);

2) active layer 52 of p-InGaAsP (Zn-doped, $1 \times 10^{17} - 1 \times 10^{19}$ cm$^{-3}$, 0.5-1.5 μm thick);

3) cladding layer 53 of p-InP (Zn-doped, $1-5 \times 10^{18}$ cm$^{-3}$, 0.5-1.0 μm thick); and 4) cap layer 54 of p-InGaAsP (Zn-diffused, $3 \times 10^{18} - 1 \times 10^{19}$ cm$^{-3}$, 1.0-1.5 μm thick).

The layers 51, 52, 53, and 54 are grown from materials contained in the wells 14, 15, 16, and 17, of FIG. 1, respectively. Each of the four layers 51, 52, 53, 54 of FIG. 2 is grown at a temperature between 624° C. and 635° C. and for different periods of time as the slide 18 transports the wafer 12 from one well to another in the LPE apparatus 10 of FIG. 1. Illustratively, annealing of the active layer occurs during the growth phases subsequent to the growth of the active layer. Alternatively, annealing could have been carried out by moving the substrate 12 into the protection chamber 11 at an elevated temperature after the epitaxial layers have all been grown.

Figure 3:
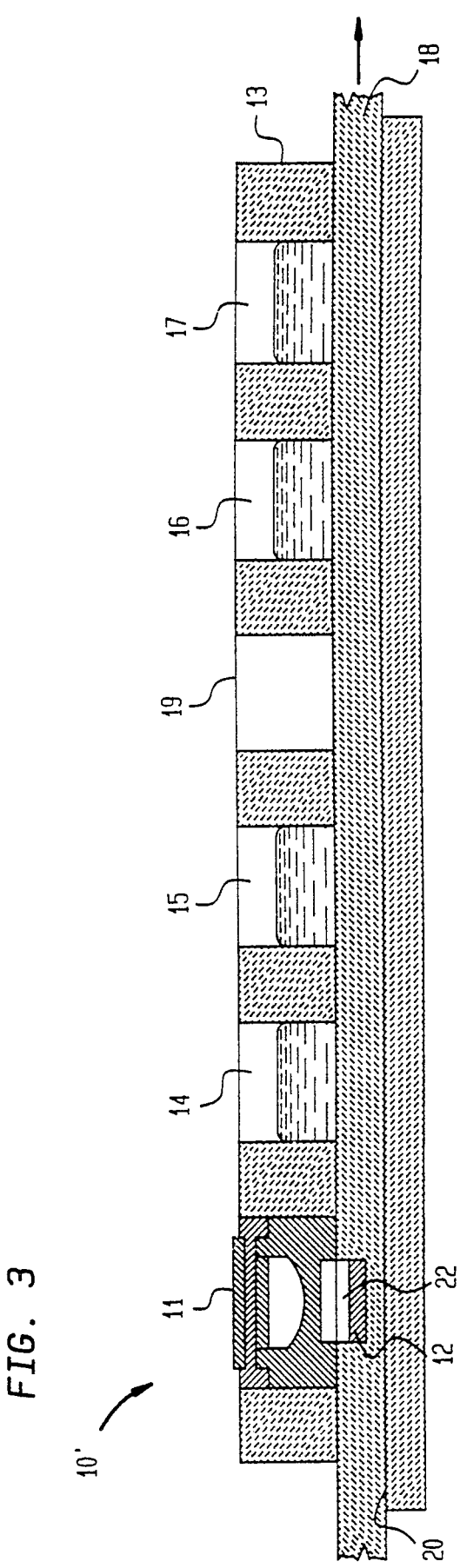
FIG. 3 is a schematic drawing of an improved liquid phase epitaxy apparatus for fabricating a Group III/Group IV semiconductor device, in accordance with the present invention.

An improved version of an LPE apparatus for carrying out the present invention is shown in FIG. 3. This LPE apparatus, designated 10', differs from that shown in FIG. 1 by the presence of an additional chamber 19 that is located immediately after the chamber 15 used for the active layer growth. The inclusion of this additional chamber in the apparatus allows maximum flexibility in exploiting the effects of the annealing process described in this work. By having an empty chamber in this location, the wafer can be annealed for an arbitrary amount of time immediately following the growth of the active layer without being constrained by the growth requirements of the subsequent layers. This allows the device designer to take maximum advantage of the annealing effect to improve the carrier concentration of the grown active layer.

After the double heterostructure of FIG. 2 is grown, post-growth processing takes place and the wafer is divided to form a plurality of individual LED chips. Metallic contacts are provided on each chip so that the resulting device can be forward biased to emit light.

As part of the present invention, a number of wafers such as that shown in FIG. 2 were fabricated by LPE with the apparatus of FIG. 1. In order to demonstrate the effect of annealing on zinc activation in the active layer 52, the growth conditions (temperature and growth time) for the buffer layer 51 and active layer 52 were held constant. However, the conditions were varied from run to run for the p-clad layer 53 and cap layer 54 such that the active layer 52 was effectively annealed during the growth of these layers. The annealing period was varied from 60 to 600 seconds, and was terminated by rapid removal and cooling of the growth boat after the last layer was grown.

Portions of the resulting wafers were tested for total zinc concentration and net carrier concentration of the active layer. First the cap and cladding layers were removed from pieces of the LED wafers using material selective etchants. Thereafter, the LED wafer samples were evaluated in a Polaron Profiler for net carrier concentration, and by secondary ion mass spectrometry (SIMS) for total zinc. In addition, ten randomly chosen devices formed from each of eight different wafers were mounted on TO headers and optical power measurements were taken at 100 ma dc and averaged.

Typical results of these measurements when annealing of the active layer was carried out at 625° C. for different periods of time are set out in Table 1 below. In Table 1, $N_A^{exp}$ is the net acceptor concentration experimentally obtained from the Polaron Profiler. $N_A^{calc}$ is the net acceptor concentration predicted from the distribution coefficient measurements of Fiedler et al, J. Crystal Growth, Vol. 74, page 27 (1986).

TABLE 1

| Sample No. | Anneal Time (sec) | $N_A^{exp}$ ($\times 10^{18}$) | $N_A^{calc}$ ($\times 10^{18}$) | Average Power (mW) |
|---|---|---|---|---|
| 1 | 71 | 3.4 | 16.0 | 1.00 |
| 2 | 88 | 2.6 | 15.7 | 0.53 |
| 4 | 183 | 6.8 | 16.0 | 0.70 |
| 5 | 183 | 4.3 | 16.4 | 0.62 |
| 8 | 224 | 12.0 | 22.3 | 1.37 |
| 9 | 252 | 1.2 | 1.6 | 1.79 |
| 12 | 411 | 0.52 | 0.6 | 1.75 |
| 15 | 550 | 0.5 | 0.6 | 1.50 |

In general, the data show that for wafers grown at 625° C. with long annealing times, e.g., annealing times of about 250 seconds or greater, the measured net acceptor concentration in the active layer approached closely the theoretical values. However, when growth conditions were chosen with short annealing times, the measured net acceptor concentration in the active layer was always smaller than the predicted value.

Figure 4:
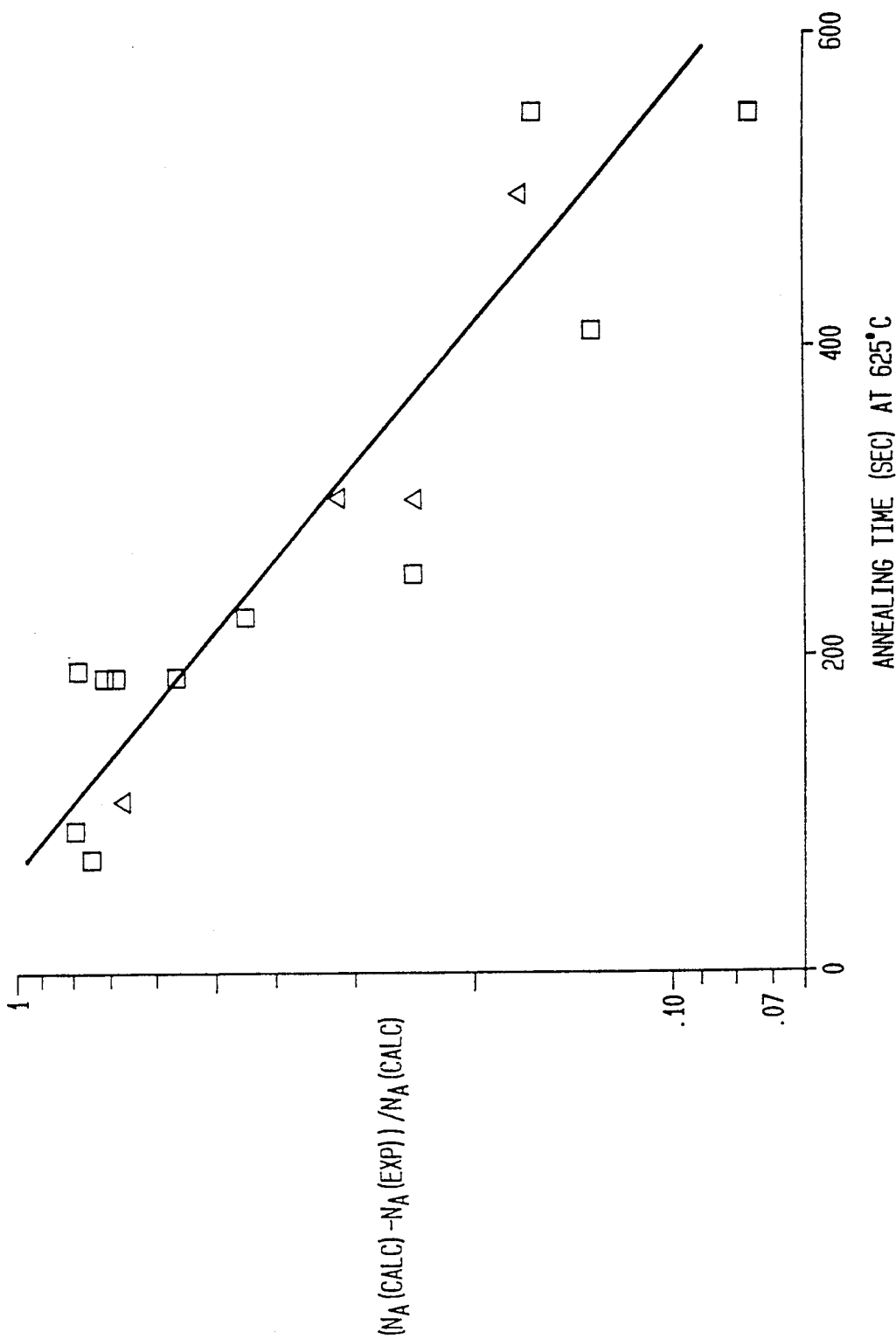
FIG. 4 is a graph correlating the net acceptor concentration and the annealing time for an LED chip, in accordance with the present invention.

This is further illustrated in FIG. 4 which is a plot of $(N_A^{calc} - N_A^{exp})/N_A^{calc}$ vs. the annealing time (t) at 625° C. In FIG. 4, the rectangles show the data taken from Table 1 as well as some additional data. A least squares fit of this data to an exponential functional form gives the following equation:

$$(N_A^{cal} - N_A^{exp})/N_A^{calc} = 1.47\, e^{(-t/193)} \qquad (1),$$

with an $R^2$ coefficient of 0.88. The least squares fit of this exponential function is shown by the straight line in FIG. 4.

In order to test the possibility that the dependency of active layer net acceptor concentration on annealing time is due to in-diffusion of zinc from the p-clad layer, several wafers were grown with undoped clad and cap layers. The results from measuring the net acceptor and total zinc concentrations in the active layers of these wafers are shown as open triangles in FIG. 4, and are seen to follow the same least squares fit. Thus, it was concluded that in-diffusion from adjacent layers played no role in the observed activation of zinc.

In addition, a wafer grown with undoped p-clad and cap layers was split into two pieces A and B. Piece A was re-annealed in a growth boat under the Sn:InP protection chamber for an additional 300 seconds. After re-annealing, the measured net acceptor concentration in the active layer of sample A increased from $2.4 \times 10^{18}$ cm$^{-3}$ to $6.7 \times 10^{18}$ cm$^{-3}$. Both Samples A and B were profiled using SIMS and had substantially the same total zinc concentration. Even though the change in acceptor level from re-annealing is nearly a factor of three, no measurable change in the total zinc was observed from the SIMS profile. It was also noted that although there was a small amount of out-diffusion as evidenced from the SIMS profile, it only amounts to about 2 percent of the total and is too small to account for the net acceptor concentration changes.

Figure 5:
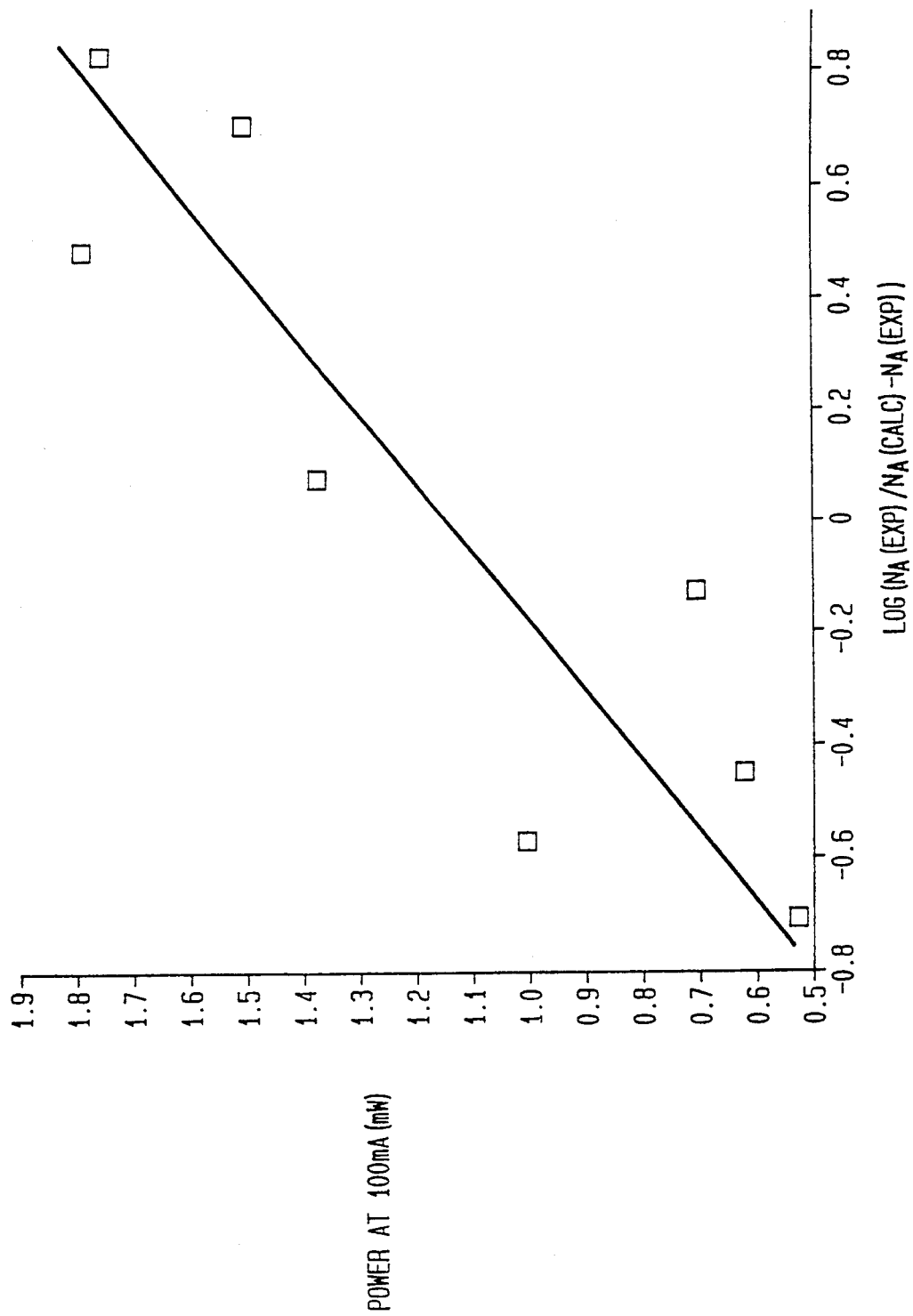
FIG. 5 is a graph correlating the power output and the net acceptor concentration for an LED chip, in accordance with the present invention.

FIG. 5 is a plot of the data from Table 1 of the power output of the LED chips at 100 mA vs. log $(N_A^{exp}/(N_A^{calc} - N_Z^{exp}))$. A least squares fit of this data gives the equation:

$$P_{100} = 0.81 \log_{10}(N_A^{exp}/(N_A^{calc} - N_A^{exp})) + 1.15 \quad (2),$$

with an $R^2$ coefficient of 0.788. The least squares fit is shown as the straight line in FIG. 5. FIG. 5 also shows that the optical power is a strong function of the ratio of activated $(N_A^{exp})$ to inactivated $(N_A^{calc} - N_A^{exp})$ zinc in the active layer and hence the annealing time. The positive correlation of output power to the ratio of activated to inactivated zinc in the active layer is markedly different from the usual negative correlation of output power to acceptor concentration reported by other researchers. See, e.g., Henry et al, in QE-19 *IEEE J. Quant. Elec.* 905 (1983); Heinen et al, *Siemens Forsch and Entwich.* 209 (1982); Grothe et al, ED-28 *IEEE Trans. Elec. Dev.* 371 (1981). Normally, the negative correlation is attributed to a larger non-radiative recombination coefficient at higher carrier concentration. It fails to take into account the relative amount of active to inactive impurities, which can be altered by the annealing scheme.

For example, this difference can be understood in the following manner. Two separate double heterostruture wafers, such as the wafers shown in FIG. 2 can be produced, each with an acceptor level of $3 \times 10^{18}$ in the active layer as measured by a Polaron Profiler type instrument. However, the first wafer achieved this acceptor level by adding 30 mg of zinc per gram of indium to the growth melt and growing for a standard time of approximately 100 seconds. The second wafer achieved its acceptor concentration by adding only 6 mg of zinc per gram of indium to the growth melt but was annealed after the active layer was grown in accordance with the present invention for approximately 500 seconds. The second wafer will have a smaller amount of inactivated zinc present in the active layer than the first wafer prepared (see FIG. 4). In addition, because the second wafer has less inactive zinc, it is expected to exhibit higher output power as indicated by FIG. 5.

While the exact mechanism for the thermal activation of zinc shown by these examples is not entirely known, it is believed to be due to a thermally activated impurity reaction in which zinc atoms change from either an inactive or a donor species into an acceptor species. One possibility is that zinc moves locally from an interstitial (donor) site to a substitutional (acceptor) site. A second possibility is that an inactive zinc-vacancy complex dissociates into a substitutional zinc and two Group V vacancies. The two possibilities may be expressed as follows:

Equation (1) above reveals that the measured characteristic time for the activation of grown-in zinc during the LPE growth of InGaAsP LED active layer at 625° C. is 193 seconds. This means that after 193 seconds, most of the inactive zinc has been activated via the mechanism of equation (3) or (4).

Another way to view this phenomenon is in terms of the activation energy $(E_s)$ required to convert inactive zinc to active zinc. In general such reactions follow the well known equation:

$$1/\tau = Ae^{(-Ea/kT)} \quad (5),$$

wherein $\tau$ is the time constant, A is an experimentally determined constant, $E_a$ is the activation energy for the reaction, k is Boltzmann's constant, and T is the temperature in °K. For the activation of zinc in InGaAsP active layers, equation (5) applies with the following conditions:

$A = 8.6 \times 10^8$ (experimentally determined);

$E_a = 2.0$ electron-volts (experimentally determined);

$k = 8.62 \times 10^{-5}$ electron-volts/°K; and $T = Tg$, the growth temperature in °K.

Thus, equation (5) as limited by these conditions relates the time required to activate zinc to the annealing temperature in InGaAsP layers, and allows one to optimize the annealing time with the annealing temperature. Once the temperature versus t (i.e. time) profile is determined, the change in activation from time "$t_1$" to time "$t_2$" can be approximated by the following formula:

$$\text{Ln (Inact)}_1 - \text{Ln (Inact)}_2 = \int_{t_1}^{t_2} b \, dt$$

where

Inact $= (N_A^{cal} - N_A^{exp})/N_A^{calc}$ $b = 1/\tau$, where $\tau$ is a function of $T(t)$ Although the constants A and E were experimentally determined for LPE grown InGaAsP layers, it is believed that similar values will be applicable for InGaAsP layers prepared by other processes as well.

In particular, for a zinc doped InGaAsP active layer, the inventive annealing step is carried out at temperatures from about 575° C. to about 675° C., it being understood that the higher the temperature, the shorter the annealing period. Preferably, the annealing step is carried out at a temperature from about 600° C. to about 650° C. for a period in excess of about 150 seconds and most preferably at a temperature of about 625° C. for a period in excess of about 190 seconds.

In summary, a method has been described for activating zinc in the active layer of InP-InGaAsP double heterostructures by annealing the active layer. The annealing may be done before, during, or after the growth of subsequent layers. For an LPE grown InGaAsP active layer, the measured characteristic time when annealing at 625° C. is about 193 seconds. As the ratio of active to inactive zinc increases, the output power of LED devices fabricated from these wafers also increases.

While the invention has been described by reference to specific examples, this was for purposes of illustration only and should not be construed to limit the spirit or the scope of the invention. Numerous alternative embodiments which would be apparent to persons skilled in the art are also considered to be within the scope of the invention.

We claim:

1. A method for fabricating a zinc doped active layer of a semiconductor device comprising growing an active layer of zinc doped Group III/Group V material, and thereafter annealing said layer at a temperature range of about 575° C. to about 675° C. and for a time within the range of about 70 seconds to about 550 seconds so as to convert inactive zinc in said layer to acceptor zinc.

2. The method of claim 1 wherein said Group III/Group V material is a semiconductor alloy having a composition of $In_xGa_{1-x}As_yP_{1-y}$, within the range $0 \leq x \leq 1$, $0 \leq y \leq 1$.

3. The method of claim 1 wherein said annealing step is carried out at least in part during the formation of subsequent layers in said semiconductor device.

4. The method of claim 1 wherein said annealing step is carried out at least in part after subsequent layers in said semiconductor device have been formed.

5. The method of claim 1 wherein said active layer is annealed at about 625° C. and for at least about 190 seconds.

6. The method of claim 1 wherein said active layer is the active layer in a double heterostructure.

7. The method of claim 1 wherein said step of growing said active layer is carried out using liquid phase epitaxy.

8. The method of claim 7 wherein said active layer is the active layer in an LED device.

9. The method of claim 1 wherein said annealing step is carried out at least in part before subsequent layers in said semiconductor device are formed.

10. A method for activating zinc dopant in the active layer of a Group III/Group V double heterostructure comprising an active layer sandwiched between a buffer layer and a cladding layer, said method comprising growing said buffer layer, said active layer and said cladding layer by liquid phase epitaxy and annealing said active layer at a temperature range of about 575° C. to about 675° C. and for a period of time within the range of about 70 seconds to about 550 seconds so as to convert inactive zinc in said active layer to acceptor to zinc.

11. The method of claim 10 wherein said annealing step is carried out at least in part during the growth of said cladding layer.

12. The method of claim 10 wherein said double heterostructure includes a cap layer grown by liquid phase epitaxy and said annealing step takes place during the growth of said cladding layer and said capping layer.

13. The method of claim 10 wherein said Group III/Group V double heterostructure is formed in the semiconductor alloy having the composition $In_xGa_{1-x}As_yP_{1-y}$, within the range $0 \leq x \leq 1$, $0 \leq y \leq 1$.

14. The method of claim 10 wherein said active layer is annealed at a temperature of about 625° C. and for at least 190 seconds.

15. The method of claim 10 wherein said annealing step takes place at least in part after the growth of the cladding layer.

16. The method of claim 10 wherein said annealing step takes place at least in part before the growth of the cladding layer.

17. The method for increasing the power output of an optoelectronic semiconductor device having a zinc doped Group III/Group V active layer, comprising annealing said active layer at a temperature range of about 575° C. to about 675° C. and for a period of time within the range of about 70 seconds to 550 seconds so as to convert inactive zinc in said active layer to acceptor zinc.

18. The method of claim 17 wherein said annealing step is carried out at least in part during the formation of other layers in said semiconductor device.

19. The method of claim 17 wherein said annealing step is carried out at least in part after formation of other layers in said optoelectronic device.

20. The method of claim 17 wherein said annealing step is carried out at least in part before the formation of other layers in said optoelectronic device.

21. The method of claim 17 wherein said semiconductor device is an InP-InGaAsP double heterostructure semiconductor device.

22. The method of claim 17 wherein said active layer is annealed at a temperature in the range of about 600° C. to about 650° C. and for at least about 150 seconds.

23. The method of claim 18 wherein said active layer is annealed at a temperature of about 625° C. and for at least 190 seconds.

24. A method for fabricating a zinc doped active layer of a semiconductor device comprising growing an active layer of zinc doped InGaAsP material using liquid phase epitaxy and thereafter annealing the layer at a temperature range of about 575° C. to about 675° C. and for a time within the range of about 70 seconds to 550 seconds so as to convert inactive zinc in said layer to acceptor zinc.

* * * * *